(12) United States Patent
Thompson et al.

(10) Patent No.: US 7,144,459 B2
(45) Date of Patent: *Dec. 5, 2006

(54) CENTRIFUGAL SWING ARM SPRAY PROCESSOR

(75) Inventors: Raymon Thompson, Kalispell, MT (US); Gordon Nelson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 297 days.

This patent is subject to a terminal disclaimer.

(21) Appl. No.: 10/200,072

(22) Filed: Jul. 19, 2002

(65) Prior Publication Data

US 2004/0013797 A1    Jan. 22, 2004

(51) Int. Cl.
*B05B 3/00*    (2006.01)
(52) U.S. Cl. .......................... 118/323; 118/731; 118/52
(58) Field of Classification Search ................ 118/52, 118/730, 429, 323, 733, 728, 731
See application file for complete search history.

(56) References Cited

U.S. PATENT DOCUMENTS

| | | | | |
|---|---|---|---|---|
| 5,143,552 A | * | 9/1992 | Moriyama | ................... 118/666 |
| 5,425,812 A | * | 6/1995 | Tsutahara et al. | ........... 118/725 |
| 5,685,908 A | * | 11/1997 | Brytsche et al. | |
| 6,068,881 A | * | 5/2000 | Valley et al. | |
| 6,451,114 B1 | * | 9/2002 | Stevens | ....................... 118/50 |
| 6,485,568 B1 | * | 11/2002 | Thallner | |
| 6,527,860 B1 | * | 3/2003 | Yoshihara et al. | |

* cited by examiner

*Primary Examiner*—Brenda A. Lamb
(74) *Attorney, Agent, or Firm*—Perkins Coie LLP

(57) ABSTRACT

A machine for processing a flat workpiece or wafer has a head, which spins the wafer between upper and lower weirs in a base. The head is spaced apart from the base by an air gap. A vacuum source attached to an exhaust opening in the base draw air through the air gap, to reduce or eliminate movement of process chemicals into the head. Corrosion of head components by process chemicals is reduced. The disadvantages of having a mechanical seal between the base and the head are also eliminated.

22 Claims, 2 Drawing Sheets

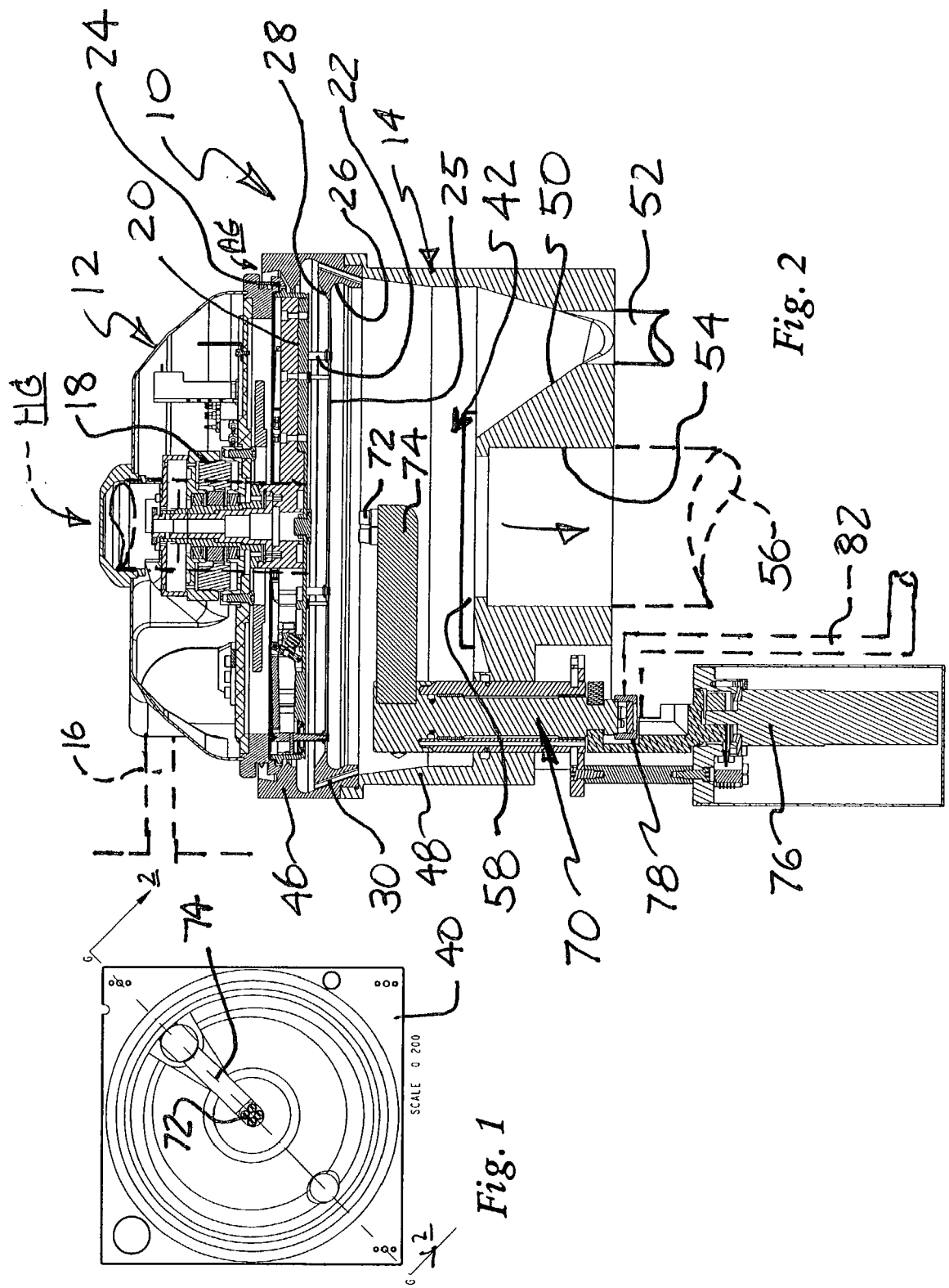

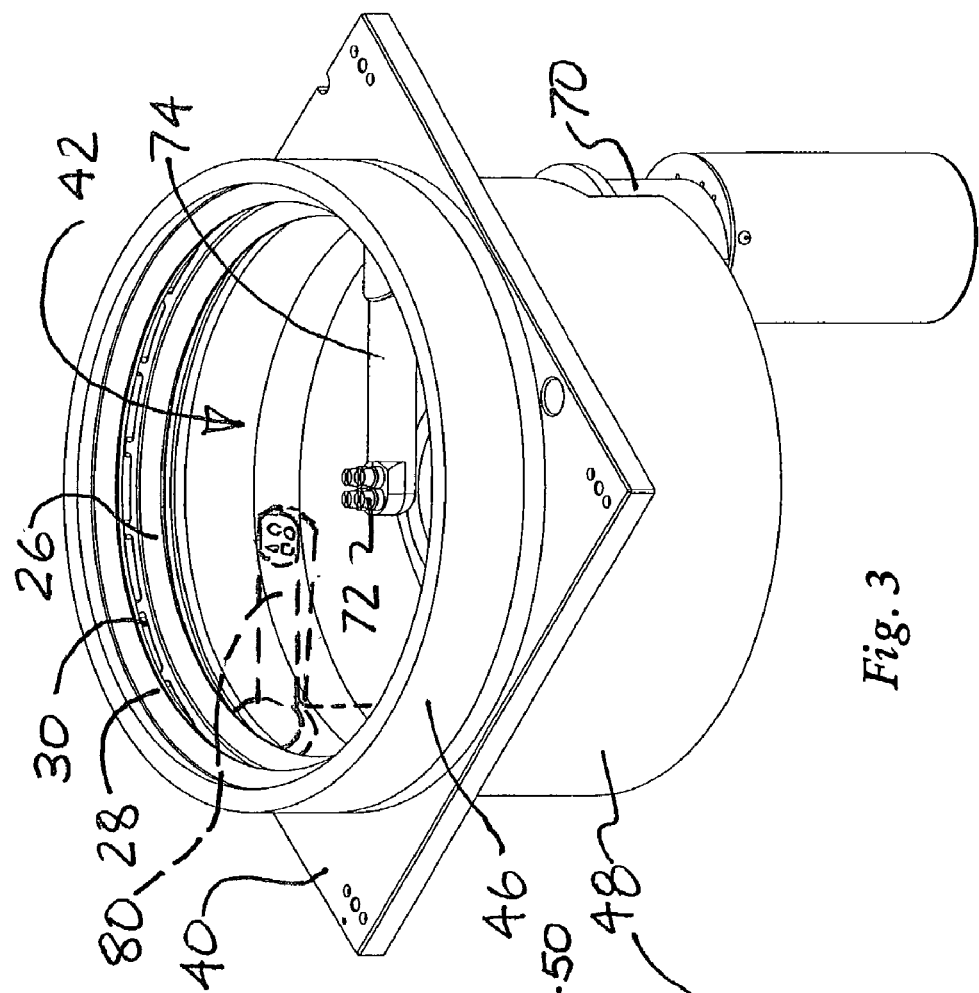
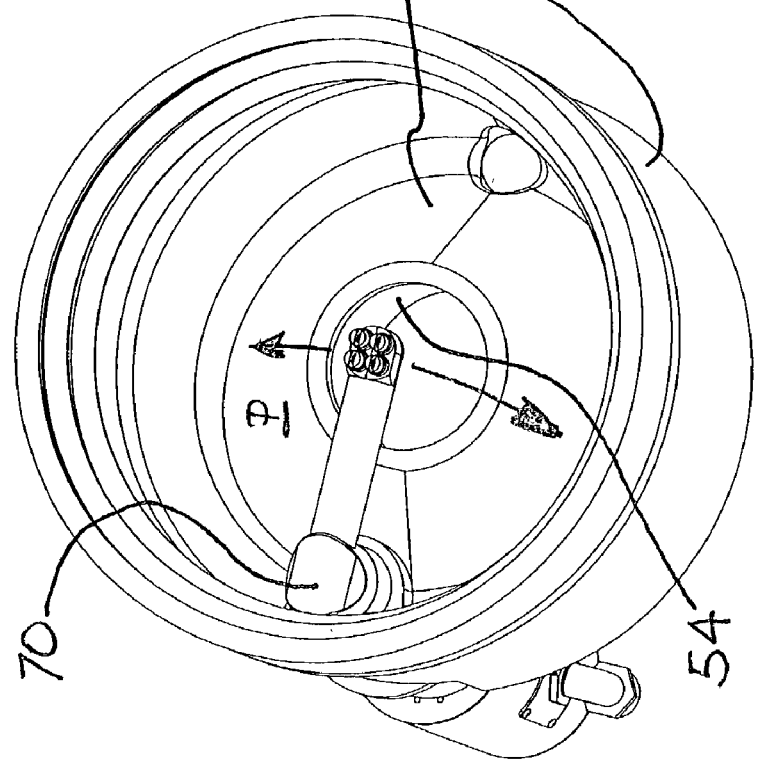
Fig. 3
Fig. 4

CENTRIFUGAL SWING ARM SPRAY PROCESSOR

BACKGROUND OF THE INVENTION

The field of the invention is systems and methods for processing a flat media workpiece.

Various systems and methods have been used in the past for processing flat media workpieces, both individually and in batches or groups of workpieces. In the semiconductor device manufacturing industry, the workpieces are typically flat, thin and round disks or wafers, often made of a semiconductor material. Depending on the manufacturing steps being performed, various liquids, gases or vapors may be applied or sprayed onto the workpiece, while the workpiece is spinning. In some manufacturing steps, process liquids or gases are applied to the bottom surface of a spinning wafer via spray nozzles on a pivoting arm. With this technique, the spinning movement of the wafer, and the reciprocating or pivoting movement of the spray arm, allows all surfaces of the workpiece to be contacted by the process liquids or gases.

While these types of systems and methods have performed well in the past, there remains a need for systems and methods having improved performance characteristics.

Accordingly, it is an object of the invention to provide an improved system and an improved method for processing flat media workpieces.

SUMMARY OF THE INVENTION

In a first aspect, air flow through a processor is used to redirect process chemicals away from the process head. As a result, corrosion of head components is reduced.

In a second and separate aspect, air flow through a process chamber allows the head and base to be spaced apart, avoiding disadvantages associated with having a seal between them to contain process liquids or gases within the process chamber.

In a third aspect, multiple chemical spray heads or applicators are provided on a swing arm, to provide increased versatility in manufacturing semiconductor devices and other flat media products.

BRIEF DESCRIPTION OF THE DRAWINGS

In the drawings, wherein the same reference number indicates the same element in each of the views:

FIG. 1 is a plan view of the base of the present process system.

FIG. 2 is a section view taken along the line 2–2 of FIG. 1, and further including a section view of a process head.

FIG. 3 is a perspective view of the base shown in FIGS. 1 and 2, with the head removed for clarity of illustration.

FIG. 4 is a perspective view similar to FIG. 3, with the view rotated to better show details of the base.

DETAILED DESCRIPTION OF THE DRAWINGS

Turning now in detail to the drawings, as shown in FIGS. 1 and 2, the present centrifugal swing arm processing system 10 includes a head 12 supported on a head lifter 16, and movable vertically to engage and disengage from a base 14. The head 12 has a wafer support system 20 including wafer supports 22, for holding a workpiece or wafer 25 by the edges. A spin motor 18 spins the workpiece 25 held by the workpiece supports 22, as described, for example, in U.S. Pat. No. 5,431,421, incorporated herein by reference. The head 12 includes a head ring 24, adapted to engage with an upper base ring or frame 46 on the base 14.

Turning to FIGS. 2 and 3, the upper base ring or frame 46 is supported on a lower base ring or frame 48. A base plate 40 is optionally attached around one or both of the upper and lower base rings 46 and 48. Alternatively, the upper and lower base rings or frames may be built as a single unit, optionally including a base plate 40. A bowl or process chamber 42 is formed within the base 14.

Referring still to FIGS. 2 and 3, a lower weir or surface 26 is provided in the upper base ring 46 adjacent to the workpiece 25. The top surface of the lower weir 26 is preferably approximately co-planar with the lower surface of the workpiece 25, when the workpiece 25 is in the process position, as shown in FIG. 2. Similarly, an upper weir 28 is positioned just above the workpiece 25, with the lower edge or surface of the upper weir 28 preferably approximately co-planar with the upper surface of the workpiece 25 when the workpiece 25 is in the process position, shown in FIG. 2. Drain slots 30 in the upper base ring or frame 46 extend from the upper weir 28 down through the upper base ring 46.

Turning now to FIGS. 2, 3 and 4, an annular liquid drain collector 50 is formed in the base 14. A liquid drain line 52 connects to a low point of the drain collector 50. The liquid drain line 52 runs to a factory or facility waste drain, or to a recirculation or reuse system. A gas or vapor exhaust opening 54 extends from the process chamber 42 through the base 14 and connects with an exhaust line or duct 56. An exhaust opening diverter cap 58 is positioned within the chamber 42 over the exhaust opening 54, to avoid or reduce movement of process liquids into the exhaust opening 54.

Referring still to FIGS. 2, 3 and 4, a process chemical spray or applicator assembly 70 includes spray heads 72 on a pivot arm 74. As shown in FIG. 2, a pivot motor 76 is linked to the swing arm 74, to pivot the swing arm back and forth along the circumferential direction P, shown in FIG. 4. A lift motor 78 is linked to the swing arm 74, to move the swing arm 74 vertically, thereby adjusting the space or gap between the spray heads 72 and the bottom surface of the workpiece 25. As shown in dotted lines in FIG. 3, a second spray or applicator assembly 80, may also be provided, similar to the spray assembly 70.

Referring to FIG. 2, a process liquid, gas or vapor supply system 82 supplies process chemicals to the spray heads 72. Preferably, four spray heads 72 are provided, to allow for simultaneous or sequential spraying for applying of one, two, three or four process chemicals, which may be liquids, vapors or gases. While the spray heads 72 are preferably spray nozzles, other types of applicators, such as brushes, dispensers, or other direct contact or flow applicators may be used. Additional description of the spray arm 74 and pivot motor 76 is provided in U.S. Pat. No. 5,658,387, incorporated herein by reference.

The ratio of the diameter of the workpiece 25 relative to the exhaust opening 54 is 8-2:1, or 4-2:1, and preferably about 3:1. The ratio of the area of the workpiece 25 to the area of the exhaust opening 54 are similarly proportionally geometrically related. The exhaust opening 54 is preferably centrally located within the annular liquid drain collector 50. The base 14 and spray assembly 70 are preferably made largely of Teflon (fluorine containing resins), to better resist corrosion by reactive process chemicals.

In use, a workpiece 25 is loaded into the head 12, by actuation of the wafer support system 20, as described in U.S. Pat. No. 5,431,421. The head 12 may be pivoted into an upside down position, relative to its position shown in FIG. 2, for loading and unloading of a workpiece 25. The head and workpiece 25 are then lowered by the head lifter 16 to a position where the wafer is positioned between the upper and lower weirs 26 and 28. The head ring 24 is spaced slightly apart from the upper base ring or frame 46, leaving an annular gap AG between them. The motor 18 is turned on to spin the workpiece 25. Process chemicals are provided by the supply system 82 to the spray assembly 70. As the swing arm 74 swings back and forth, driven by the pivot or swing motor 76, the process chemicals are sprayed out of the spray heads 72 onto the bottom surface of the spinning workpiece 25. Alternatively, the process chemicals may be applied to the spinning workpiece via other applicators or direct contact techniques, rather than spraying. The process chemicals may include acids, gases, such as nitrogen, (at room temperature, or heated) deionized water, isopropylalcohol, as well as other liquids or gases.

As the workpiece spins, the process chemicals applied to the bottom surface of the workpiece flow outwardly, under centrifugal force. As the process chemicals reach the lower weir 26, they are redirected or diverted downwardly into the chamber 42. The curvature of the lower weir 26 reduces the tendency for any liquid chemical flung off the edges of the workpiece to splatter back onto the workpiece 25, thereby reducing potential for contamination of the workpiece. Additional process chemicals may be provided to the top surface of the workpiece 25 through the head 12. Process chemicals supplied by the spray heads 72 may also travel up to the top surface of the workpiece. Liquid process chemicals on the top surface of the workpiece (if any), are flung off the workpiece 25 via centrifugal force, and are redirected by the upper weir 28 to the drain slots 30. The liquid process chemicals then run down through the angle drain slots 30 into the chamber 42, at a position substantially below the workpiece 25. The upper weir 28 and drain slots 30 help to avoid re-deposition of process liquid onto the workpiece 25.

The used process liquid drains down into the liquid drain collector 50 and is removed from the base 14 via the liquid drain line 52. The used liquid process chemicals removed via the liquid drain line 52 may be reused, held, treated or otherwise disposed of.

During processing of the workpiece 25, a vacuum source is applied to the exhaust line 56. This results in continuous air flow through the gap AG between the head 12 and the base 14, into the chamber 42 and out through the exhaust line 56. The cross-section areas of the gap AG and the exhaust line 56, as well as the vacuum source, are selected to provide sufficient air flow down through the processor 10, to avoid leakage or migration of gases or vapors up and out of the processor 10 through the gap AG. The exhaust opening cap 58 reduces or prevents liquids from entering the exhaust opening 54 and exhaust line 56.

As the flow of air in through the gap AG and out through the opening 54 confines the process chemicals within the processor 10, no seal is needed between the head 12 and the base 14. Accordingly, the drawbacks of using a seal, such as an inflated seal, including potential for contamination, reliability and maintenance factors, are eliminated. In addition, as a result of the air flow through the processor 10, corrosion of components within the head 12 process chemicals is reduced or avoided. Vapors or gases supplied by the spray heads 72 contact the bottom surface of the workpiece 25, but are then pulled down and away from the head 12 by the flow of air through the processor 10. The vapors or gases are then exhausted or removed along with the air drawn out of the chamber through the exhaust opening 54 by the vacuum source.

Depending on the specific application, the spacing between the spray heads 72 (or other applicators on the swing arm 74) is adjusted as needed by the lift motor 78.

In an alternative embodiment, the head 12 may have a large through opening or duct HG, shown in dotted lines in FIG. 2, to allow for air flow down through the processor 10. If the head duct or opening HG is provided, then the head 12 can optionally seal against the base 14, while still providing downward air flow, to reduce corrosion of head components by process chemicals. Alternatively, a head 12 including the duct HG can also be operated spaced apart from the base 14, with air flowing through the processor 10 from both the duct HG and the annular gap AG between the head ring 24 and the upper base ring 46. To provide room for the duct HG, the alternative head 12 may be provided with an alternative spin motor 18 positioned around the outside of the duct HG. The air flow rate through of the gap AG may be adjusted before or during processing, to change air flow, by operation of the head lifter 16. Similarly, an air flow valve, vane or iris may be provided at the duct HG, if used.

The inventive air flow features described may be used in other types of processors as well, including processors which do not have a swing-spray arm, a head for spinning the workpiece, or both.

Thus, a novel flat media workpiece processor has been shown and described. Various changes, modifications and substitutions may of course be made without departing from the spirit and scope of the invention. The invention, therefore, should not be limited, except to the following claims, and their equivalence.

The invention claimed is:

1. A flat media workpiece processor comprising:
   a base having a spray assembly, with the spray assembly including at least one liquid spray head on a swing arm, and a motor linked to the swing arm to provide reciprocating swing arm movement within the base;
   a head for holding the workpiece;
   a liquid drain collector in the base;
   a liquid drain line connecting to the liquid drain collector; and
   a gas exhaust opening in the base, with an air flow opening between the head and the base, to allow air to flow into the base and out of the exhaust opening.

2. The processor of claim 1 further comprising a vacuum source connected to the exhaust opening.

3. The processor of claim 1 with the head moveable into a processing position wherein the workpiece is positioned within the base, and with the head separated from the base by an annular gap, when in the processing position, to allow air flow into the base and out through the exhaust opening.

4. The processor of claim 1 with the base including a lower weir aligned with a lower surface of the workpiece, and an upper weir aligned with an upper surface of the workpiece, when the head is in a processing position.

5. The processor of claim 4 further comprising an annular curved surface on the lower weir.

6. The processor of claim 1 with the head spaced apart from the base via a gap, for allowing air to flow through the base and out of the gas exhaust opening, and with the head including a workpiece support system positioned below the gap.

7. A machine for processing a flat workpiece, comprising:
   a head;
   a workpiece support system in the head, for holding the workpiece;
   a base having a process chemical application assembly including at least one liquid spray opening on a swing arm, and a motor linked to the swing arm to provide reciprocating swing arm movement within the base;
   an exhaust opening in the base;

with the head spaced apart from the base via a gap, for allowing air to flow through the base and out of the exhaust opening; and with the workpiece support system positioned below the gap.

8. The processor of claim 7 further comprising a liquid drain collector in the base, and a liquid drain line connecting to the liquid drain collector.

9. The processor of claim 7 further including a diverter cap over the exhaust opening, to reduce movement of liquids into the exhaust opening.

10. The machine of claim 7 further comprising a lower weir having a top surface approximately co-planer with a lower surface of the workpiece, and an upper weir having a lower surface approximately co-planer with an upper surface of the workpiece, when the head is in a processing position over the base.

11. The machine of claim 7 with the exhaust opening having a diameter ranging from 1/8 to 1/2 of the diameter of the workpiece.

12. The machine of claim 7 with the workpiece having an area of from about 4 to 64 times greater than the area of the exhaust opening.

13. The machine of claim 7 with the workpiece having an area of from about 4 to 16 times greater than the area of the exhaust opening.

14. A flat media workpiece processor, comprising:
a base having a first weir and a second weir spaced vertically apart from the first weir;
a process chemical application assembly in the base and including at least one liquid sprayer on a swing arm;
a head for holding the workpiece, and with the head moveable between a process position, where the head holds the workpiece between the first and second weirs, and a load/unload position, where the head is spaced apart from the base; and
an exhaust opening in the base.

15. A machine for processing a flat workpiece, comprising:
a head;
a workpiece support system in the head, for holding a workpiece;
a motor in the head for spinning the workpiece;
a base having a process chemical application assembly, including a lower weir and an upper weir, on the base with the lower weir having a upper surface approximately co-planer with a lower surface of the workpiece, and the upper weir having a lower surface approximately co-planer with an upper surface of the workpiece during processing;
an exhaust opening in the base; and
with the head spaced apart from the base via a gap during processing, for allowing air to flow down through the machine and out of the exhaust opening.

16. The machine of claim 15 with the exhaust opening having a diameter ranging from 1/8 to 1/2 of the diameter of the workpiece.

17. A machine for processing a flat workpiece, comprising:
a head;
a workpiece support system in the head, for holding a workpiece;
a motor in the head for spinning the workpiece;
a base;
a head lifter attached to the head, and with the head moveable via the head lifter to engage with the base to form a process chamber;

a process chemical application assembly in the base, including at least two spray heads on a swing arm, and a motor linked to the swing arm to provide reciprocating swing arm movement within the base, with the spray heads positioned to spray process fluids substantially vertically upwardly onto a lower surface of spinning workpiece;
a gas/vapor exhaust opening in the base;
a cap on the exhaust opening to reduce movement of liquid from the process chamber into the gas/vapor exhaust opening;
a gas/vapor exhaust line connecting with the exhaust opening in the base;
a liquid drain collector formed at a low point in the base;
a liquid drain line connecting to the liquid drain collector; and
a process chemical supply system linked to the process chemical application assembly, for supplying first and second process chemicals to the first and second spray heads, respectively.

18. The machine of claim 17 further comprising third and fourth spray heads on the swing arm, and with the process chemical supply system supplying third and fourth process chemicals to the third and fourth spray heads, respectively.

19. The machine of claim 17 wherein the gas/vapor exhaust opening is substantially centrally located in the base, and wherein the liquid drain collector is located to one side of the gas/vapor exhaust opening.

20. A flat media workpiece processor comprising:
a base having a spray assembly, with the spray assembly including at least one spray head on a swing arm, and a motor linked to the swing arm to provide swing arm movement within the base;
a head for holding the workpiece;
a gas exhaust opening in the base;
a lower weir in the base aligned with a lower surface of the workpiece, and an upper weir in the base aligned with an upper surface of the workpiece, when the head is in a processing position.

21. A flat media workpiece processor comprising:
a base having a spray assembly, with the spray assembly including at least one spray head on a swing arm, and a motor linked to the swing arm to provide swing arm movement within the base;
a head for holding the workpiece;
a gas exhaust opening in the base; and
a diverter cap over the exhaust opening, to reduce movement of liquids into the exhaust opening.

22. A flat media workpiece processor comprising:
a base having a spray assembly, with the spray assembly including at least one spray head on a swing arm, and a motor linked to the swing arm to provide reciprocating swing arm movement within the base;
a gas exhaust opening in the base;
a liquid drain collector in the base;
a liquid drain line connecting to the liquid drain collector; and
a head for holding the workpiece, with the head moveable into a processing position wherein the workpiece is positioned within the base, and with the head separated from the base by an annular gap, when in the processing position, to allow air flow into the base and out through the exhaust opening.

* * * * *